United States Patent [19]

Kitano et al.

[11] Patent Number: 5,041,901
[45] Date of Patent: Aug. 20, 1991

[54] LEAD FRAME AND SEMICONDUCTOR DEVICE USING THE SAME

[75] Inventors: Makoto Kitano, Tsuchiura; Asao Nishimura, Ushiku; Akihiro Yaguchi; Sueo Kawai, both of Ibaraki; Akio Hoshi, Isesaki; Ichio Shimizu, Gunma, all of Japan

[73] Assignee: Hitachi, Ltd., Tokyo, Japan

[21] Appl. No.: 518,410

[22] Filed: May 2, 1990

[30] Foreign Application Priority Data
May 10, 1989 [JP] Japan .................................. 1-114953

[51] Int. Cl.[5] ............................................. H01L 23/48
[52] U.S. Cl. ...................................... 357/70; 357/67; 357/71
[58] Field of Search ............................. 357/67, 71, 70

[56] References Cited
FOREIGN PATENT DOCUMENTS
59-36952 2/1984 Japan .

OTHER PUBLICATIONS
"Thermal Fatigue Strength Estimation of Solder Joints of Surface Mount IC Packages"; Kitano et al.; p. 1709.
Applicants Prior Art Figs. 11 and 13.

Primary Examiner—Eugene R. LaRoche
Assistant Examiner—R. Ratliff
Attorney, Agent, or Firm—Antonelli, Terry, Stout & Kraus

[57] ABSTRACT

A lead frame having a plurality of inner leads and outer leads, said outer leads being subjected to surface treatment for improving solder wettability at an end portion and to sruface treatment for suppressing solder wettability at least at a portion neighboring to the end portion, or said outer leads being bent 4 times or more, is effective for improving thermal fatigue life and reliability when applied to a semi-conductor device.

20 Claims, 10 Drawing Sheets

LEAD FRAME AND SEMICONDUCTOR DEVICE USING THE SAME

BACKGROUND OF THE INVENTION

This invention relates to a lead frame particularly excellent in reliability at solder joints and a semiconductor device using the same.

In due to the recent increasing demand on surface mount type semiconductor devices leads of these devices are directly soldered onto a substrate. Generally speaking, since a linear thermal expansion coefficient of a semiconductor device (a package) and that of a substrate are different, when subjected to repeated temperature changes, thermal strain takes place repeatedly in solder joints, often resulting in causing solder joint fracture due to thermal fatigue. This is a serious problem from the viewpont of reliability.

In order to improve the reliability of lead solder joints of semiconductor devices, Japanese Patent Unexamined Publication No. 59-36952 discloses a process wherein solder wettability of the whole surface of the lead is bettered, and Japanese Patent Unexamined Publication Nos. 59-108334 and 61-270856 disclose processes wherein the shape of the leads is improved so as to broaden a solder joint area of the leads. According to the process wherein solder wettability of the whole surface of its leads is bettered, a thermal fatigue life of the solder can be improved since concentration of strain due to defects of the solder joint can be prevented. But, according to this process, there is a danger of covering the whole surface of the leads with solder when a larger amount of solder is used. In such a case, since relative displacement of substrate and package due to temperature change cannot be absorbed by bending deformation of the leads, strain in the solder joint is increased reversely. As a result, solder fatigue life often decreases. Particularly when leads become finer and finer as in semiconductor packages of recent years, there is a large possibility to solder in excess. On the other hand, according to the process wherein the joint area of solder is enlarged, the average strain of the solder may be lessened, but there is little effect on improving the thermal fatigue life due to no consideration on portions causing maximum strain.

SUMMARY OF THE INVENTION

It is an object of the present invention to provide a lead frame improved in thermal fatigue life and reliability of solder joints of leads so as to secure the use of a proper amount of solder overcoming the defects of prior art processes.

It is another object of the present invention to provide a semiconductor device using said lead frame.

The present invention provides a lead frame comprising a plurality of inner leads to be packaged and a plurality of outer leads, each end portion of said outer leads connecting to a mounted substrate being subjected to surface treatment so as to improve solder wettability at least in the case of solder wettability being insufficient, and at least each portion neighboring to said end portion of outer lead being subjected to surface treatment so as to suppress solder wettability.

The present invention also provides a lead frame comprising a plurality of inner leads to be packaged and a plurality of outer leads, each outer lead being bent at least 4 times and an end horizontal portion of each outer lead being provided for face bonding to a substrate.

The present invention further provides a semiconductor device comprising at least one semiconductor chip, a lead frame, wires electrically connecting inner leads of said lead frame to said chip, and an encapsulant encapsulating the chip, the inner leads and the wire, said lead frame comprising a plurality of inner leads and a plurality of outer leads, each end portion of said outer leads connecting to a mounted substrate being subjected to surface treatment so as to improve solder wettability at least in the case of solder wettability being insufficient, and at least each portion neighboring to said end portion of outer lead being subjected to surface treatment so as to suppress solder wettability.

The present invention still further provides a semiconductor device comprising at least one semiconductor chip, a lead frame, wires electrically connecting inner leads of said lead frame to said chip, and an encapsulant encapsulating the chip, the inner leads and the wire, said lead frame comprising a plurality of inner leads and a plurality of outer leads, each outer lead being bent at least 4 times and an end horizontal portion of each outer lead being provided for face bonding to a substrate.

DESCRIPTION OF THE PREFERRED EMBODIMENTS

Some of the present inventors studied thermal fatigue strength estimation of solder joints of surface mount IC packages and disclosed results of this study in J. Japan Society of Mechanical Engineers (A edition) vol. 54, No. 505, pp. 1709-1715 (Sep. 1988). Based on this study, the present inventors studied a relationship between a soldering height and thermal strain when outer leads of a semiconductor device were soldered. There was used a semiconductor device having solder joints of leads called butt leads used in a small outline I-leaded package or quad plat I-leaded package as shown in FIG. 11.

Figure 11:
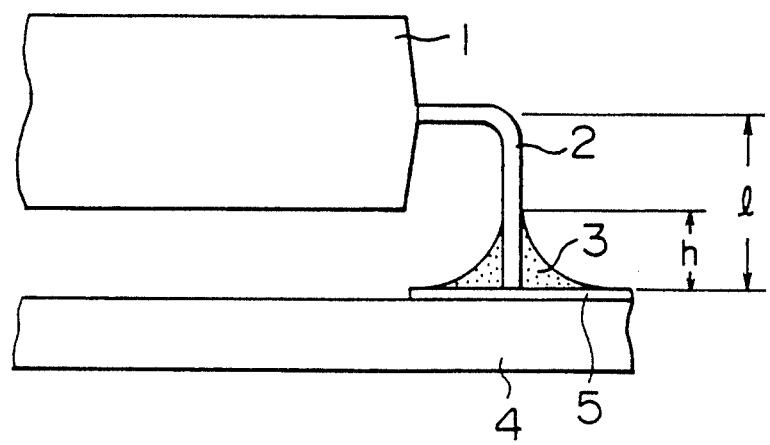
FIGS. 11 and 13 are cross-sectional views of prior art semiconductor devices mounted on substrates.

In FIG. 11, a lead 2 leading from a side of a package 1 is bonded to a land 5 formed on a substrate 4 by solder 3. In this package, the height of lead is defined as "l" and the wetting height of solder is defined as "h". The wetting height is determined by the amount of solder used for soldering and solder wettability of the lead surface. The larger the solder amount becomes or the better the wettability becomes, the larger the wetting height becomes. For packaging, there is used usually a resin having a linear thermal expansion coefficient of about $20 \times 10^{-6}/°$ C. Further, as a substrate, there is usually used a glass-epoxy plate having a linear thermal expansion coefficient of about $10 \times 10^{-6}/°$ C. or a ceramic plate having a linear thermal expansion coefficient of less than $10 \times 10^{-6}/°$ C. Since the linear thermal expansion coefficients of the package 1 and the substrate 4 are different as mentioned above, relative displacement is generated between the side portion of package and solder joints of the substrate due to temperature change, resulting in generating thermal strain on solder joints 3 due to this displacement.

Figure 12:
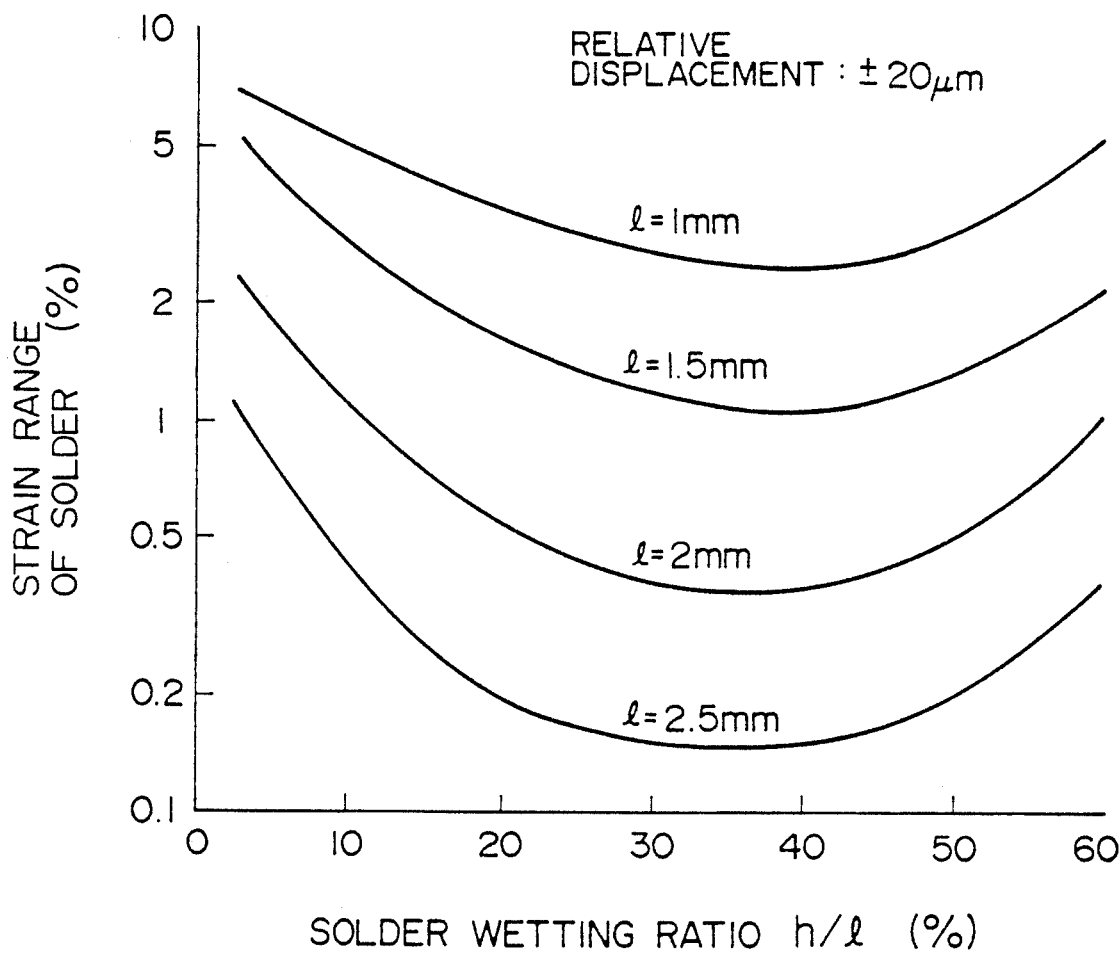
FIG. 12 is a graph showing a relationship between a solder wetting ratio and a solder strain range of the semiconductor device shown in FIG. 11.

In FIG. 12, there is shown the result of an analysis of a relationship between a ratio of solder wetting height (h) to lead height (l), i.e. solder wetting ratio (h/l) and strain range of solder 3 when relative displacement of $\pm 20$ μm is provided. The ordinate axis uses a logarithmic scale.

FIG. 12 clearly shows that the strain range is minimum in almost all the cases in the solder wetting ratio of 25% to 45% in every lead height. When the solder wetting ratio is smaller than 25% or larger than 45%, the strain range becomes larger. This means that there is a most suitable value in the solder wetting height of butt leads.

Reasons for this seem to be as follows. In the range smaller than the solder wetting ratio of 25%, since the amount of solder against the moment generated in solder joints by relative displacement of the package and the substrate becomes smaller when the wetting ratio becomes smaller, the strain generated becomes greater. In contrast, in the range larger than the solder wetting ratio of 45%, since the length of lead covered by solder is long, the length of flexible portion of lead necessary for absorbing the relative displacement becomes shorter and strain becomes greater since the moment generated in the solder joints becomes larger. When the wetting ratio is in the range of 25% to 45%, the two factors for increasing the strain of solder mentioned above negate mutually to provide the most suitable state. Heretofore, only the former factor among the two factors was noticed and an effort was made so as to increase the wetting properties of the whole lead. But, the present inventors found quantitatively that the fatigue life was also lowered when the solder was wetted too much.

Figure 17:
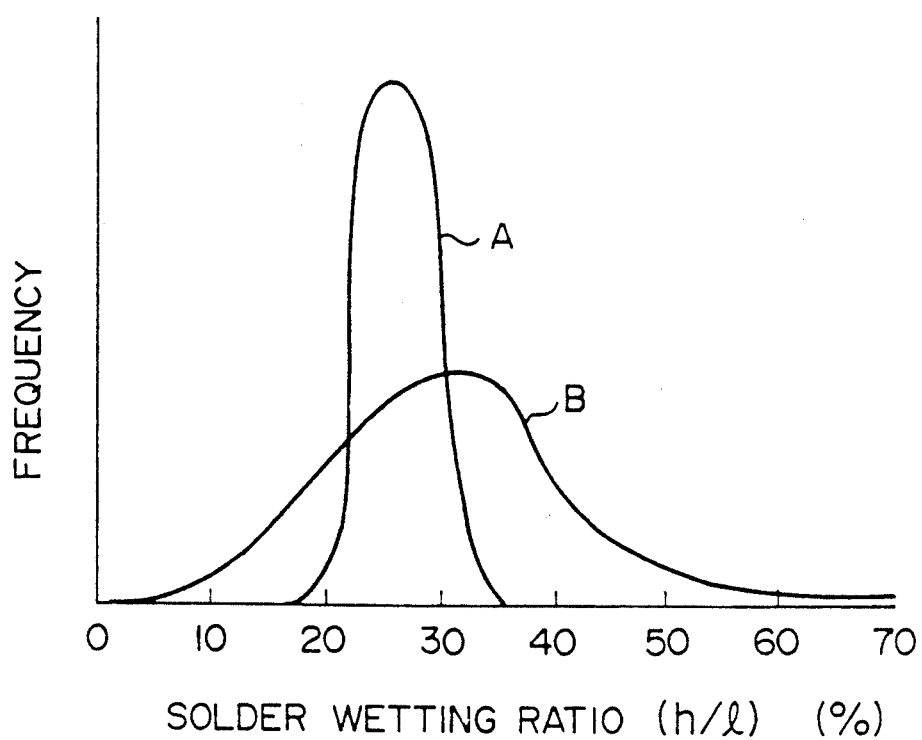
FIG. 17 is a graph showing a frequency distribution of solder wetting ratio of the semiconductor device of Example 1 in comparison with a prior art semiconductor device.

But even if the solder wetting ratio (h/l) is made in the range of 25% to 45%, the prior art semiconductor device as shown in FIG. 11 has a broad distribution of the frequency of solder wetting ratio as shown in the curve B shown in FIG. 17, which results in making it impossible to give semicondcutor devices improved thermal fatigue life and reliability. Further, in such a case, a phenomenon of bridging takes place on the soldered portions of individual outer leads to bring about undesirable short-circuit, resulting in lowering of reliability. According to the present invention, such a defect can be overcome.

According to the present invention, the lead frame comprises a plurality of inner leads to be encapsulated with an encapsulant and a plurality of outer leads, each end portion of said outer leads connecting to a mounted substrate being subjected to surface treatment so as to improve solder wettability at least in the case of solder wettability being insufficient, and at least each portion neighboring to said end portion of outer lead being subjected to surface treatment so as to suppress solder wettability.

That the solder wettability being insufficient means that a lead frame is made of stainless steel, aluminum, etc., and is insufficient in bonding to solder when soldering is conducted. In contrast, that the solder wettability being sufficient means that a lead frame is made of copper, iron, nickel, and alloys of these metals. The surface treatment for improving solder wettability should be carried out when the solder wettability of outer leads is insufficient. In contrast, when the solder wettability of outer leads are sufficient, such a surface treatment can be omitted but is preferable so as to improve the reliability.

At least the portion neighboring to the end portion to be soldered is subjected to surface treatment so as to suppress solder wettability.

Figure 1:
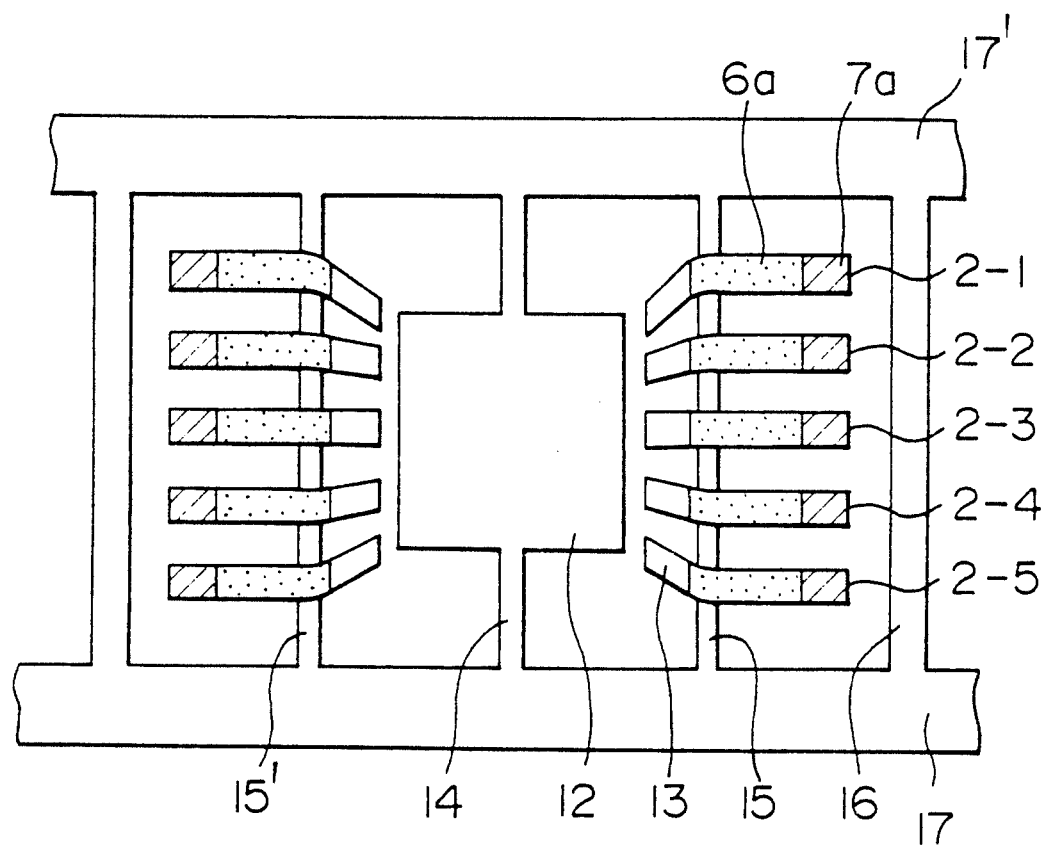
FIG. 1 is a plane view of one exmaple of the lead frame of the present invention.

One example of the lead frame of the present invention is shown in FIG. 1. In FIG. 1, a chip pad 12 is connected to an outer frame 17 and 17' via a chip pad support frame 14. A plurality of inner leads 13 and a plurality of outer leads 2 are formed in one body and connected via a support frame 15. The outer lead 2 comprises an end portion subjected to surface treatment for improving solder wettability (7a) and a neighboring portion subjected to surface treatment for suppressing solder wettability (6a). The outer frame 17 and 17' are connected by the support frame 16.

The surface treated portion for suppressing solder wettability (6a) can be formed by a process for coating a resin such as a solder resist material usually used in the production of printed circuit boards, a process for bonding a metal having no solder wettability properties such as aluminum to lead surfaces by plating, sputtering, pressing, or the like, a process for modifying the lead surface by oxidation or the like, etc. In the case of the process for modifying the lead surface, the resulting oxidized film shoulder not be corroded by a flux used for soldering. As the resin for solder resist, there can be used conventionally used resins such as polyimides, polyamideimides, epoxy resins, and the like.

The surface treated portion for improving solder wettability (7a) can be formed by conventionally used surface treatment for leads of semiconductor devices such as solder plating, solder dipping, nickel plating, etc. It is possible to bond a metal having good solder wettability such as copper, gold, etc. to lead surfaces by plating, sputtering, pressing, or the like.

In the present invention, various combinations of surface treatments are possible, for example, (i) when the outer leads are made of a metal having good solder wettability, only the portion except for the end portion to be soldered is subjected the surface treatment for suppressing solder wettability, (ii) the end portion of outer lead to be soldered is subjected to surface treatment for improving solder wettability and the rest of the portion of the outer lead is subjected to surface treatment for suppressing solder wettability, irrespective of the kind of material of outer lead, and (iii) the whole surface of outer lead is subjected to surface treatment for improving solder wettability and the portion not to be soldered is subjected to surface treatment for suppressing solder wettability.

In the present invention, any one of the above-mentioned three cases can be employed depending on the material used for lead frame and the structure of semiconductor devices.

As the solder, a conventionally used solder can be used e.g. solder comprising lead and tin, particularly lead-tin series eutectic solder (Pb 40%, Sn 60%).

As the encapsulant, there can be used a conventionally used resin such as an epoxy resin containing filler.

Figure 4:
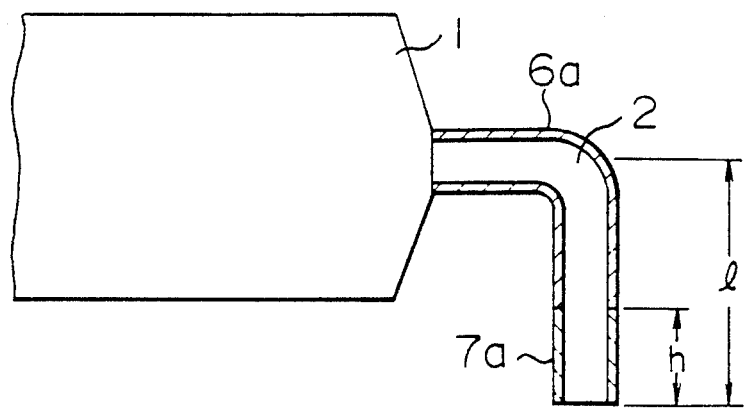
FIG. 4 is a cross-sectional view of a part of the semiconductor device of Example 1 of the present invention.

The lead frame preferably takes a structure wherein a portion to be mounted with a chip pad is formed in the center and a plurality of inner leads are arranged around the chip portion symmetrically or radiately. A plurality of outer leads comprise end portions (h) subjected to surface treatment for improving solder wettability and the rest of portions subjected to surface treatment for suppressing solder wettability, the length of the end portions (h) being preferably 25% to 45% of the length (l) from the end to a right angle bend of the outer lead as shown in FIG. 4.

The semiconductor device of the present invention comprises at least one semiconductor chip, a lead frame, wires electrically connecting inner leads of said lead frame to said chip, and an encapsulant encapsulating the chip, the inner leads and the wires, said lead frame comprising a plurality of inner leads and a plurality of outer leads, each end portion of said outer leads connecting to a mounted substrate being subjected to surface treatment so as to improve solder wettability at least in the case of solder wettability being insufficient, and at least each portion neighboring to said end portion of outer lead being subjected to surface treatment so as to suppress solder wetting properties. Particularly preferably, each outer lead has the end portion (h) in the length of 25% to 45% of the length (l) from the end to a right angle bend of the outer lead as shown in FIG. 4. Examples of such most suitable embodiments of semiconductor devices are small outline I-leaded packages (SOI) and quad flat I-leaded packages (QFI).

Figure 2:
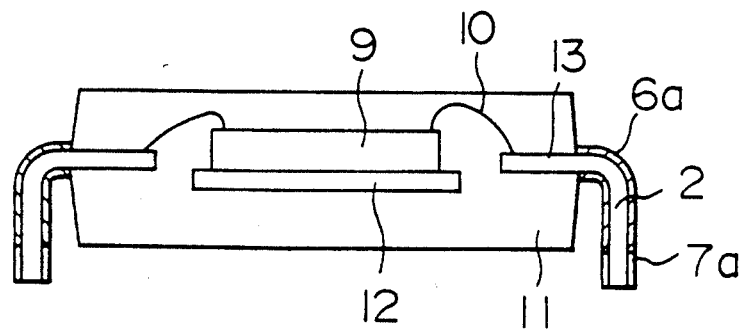
FIG. 2 is a cross-sectional view of one example of the semiconductor device of the present invention.

FIG. 2 shows one example of the semiconductor device of the present invention.

FIG. 2 is a cross-sectional view of a small outline I-leaded package, wherein a chip 9 is mounted on a chip pad 12 and an electrode of the chip 9 is connected electrically to an inner lead 13 by a wire 10. The chip, the inner lead and the wire are encapsulated with an epoxy resin 11 containing filler. The outer lead 2 comprises an end portion subjected to surface treatment for improving solder wettability (7a) and a portion subjected to surface treatment for suppressing solder wettability (6a). The semiconductor device of FIG. 2 can be formed by mounting the chip on the chip pad, electrically connecting the chip with inner leads 13, encapsulating the portion surrounded by the support frame 15 and 15' and the outer frame 17 and 17' with a resin such as a filler-containing epoxy resin, cutting all of the support frame 15 and 15' and a part of chip and support frame 14 for removing, and bending the outer leads 2.

The semiconductor device of the present invention can take another form wherein a lead frame comprises a plurality of inner leads and a plurality of outer leads, each outer lead being bent at least 4 times and an end horizontal portion of each outer lead being provided for face bonding to a substrate. Such a device can take small outline packages (SOP) and quad flat packages (QFP).

According to the present invention, relative positions of a mounted substrate and the semiconductor device are decided so as to absorb the strain by bending of of outer lead and so as to make a sufficient amount of solder adhere to the end horizontal portion of the outer lead, which is bonded to the mounted substrate.

In this case, by subjecting the portion of outer lead except for the soldering portion to surface treatment for suppressing solder wettability and subjecting the portion to be soldered to surface treatment for improving solder wettability, the reliability of the semiconductor device can further be improved.

In any cases, the solder wetting height of the outer lead of a semiconductor device can be decided by the amount of solder used for soldering and the solder wettability of lead surface. The larger the solder amount becomes or the better the solder wettability becomes, the larger the wetting height becomes. Usually, a resin having a linear thermal expansion coefficient of about $20 \times 10^{-6}/°$ C. is used for encapsulation, and the substrate is a glass-epoxy plate having a linear thermal expansion coefficient of about $10 \times 10^{-6}/°$ C. or a ceramic plate having a linear thermal expansion coefficient less than $10 \times 10^{-6}/°$ C. Since the linear thermal expansion coefficients of the package and the substrate are different, relative displacement between the side face of package and the solder joint occurs due to temperature changes. Thermal strain seems to be generated in the solder joint due to this deformation.

The present inventors found that there was a suitable amount of a solder for the wetting height of solder of butt lead. When the amount of solder is too small, the strain generated becomes larger due to a smaller amount of the solder against the moment generated in the solder joint due to the relative displacement of the package and the substrate. In contrast, when the amount of solder is too large, the lead portion controlled by the solder becomes too long. As a result, the length of freely flexible portion of the outer lead necessary for absorbing the relative displacement becomes shorter, resulting in making the strain larger due to larger moment generated in the solder joint. Therefore, if the amount of solder is adjusted properly according to the present invention, the two factors for enlarging the strain of solder are negated mutually to provide the most suitable state. Such a state can be obtained by special treatment of the present invention.

In order to lessen the strain generated and to improve the fatigue life of solder, it is insufficient to simply select the height of soldering at the end portion of outer lead as shown in FIG. 17 by the curve B, wherein the distribution of the frequency of the solder wetting ratio (h/l) is very broad and the resulting semicondcutor device is insufficient in thermal fatigue life and reliability. In contrast, when the portion of the outer lead not to be soldered is subjected to surface treatment for suppressing the solder wettability, and the end portion of the outer lead to be soldered is subjected to surface treatment for improving the solder wettability so as to make the solder wetting ratio (h/l) 25% to 45%, the distribution of the frequency is very narrowed as shown in FIG. 17 by the curve A. This is a very surprising effect of the present invention.

This invention is illustrated by way of the following Examples.

EXAMPLE 1

Figure 3:
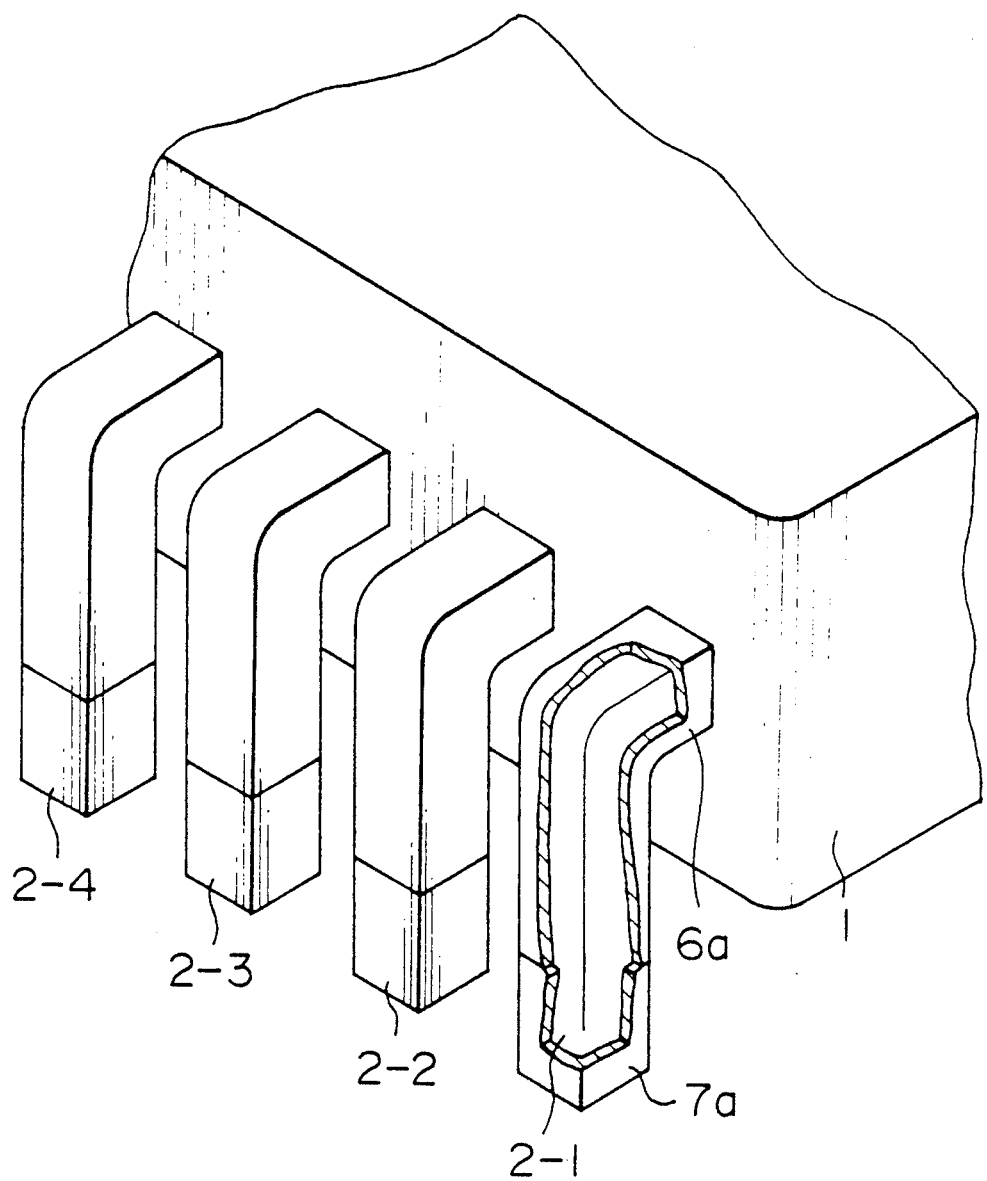
FIG. 3 is a perspective view of a partial, characteristic portion of the semiconductor device of Example 1 of the present invention.

FIG. 3 is a perspective view of a part of one side of small outline I-leaded package, which has outer leads leading from opposite sides of the package. A part of surface portions 7a and 6a of an outer lead 2-1 is removed in order to show an inner structure. Each outer lead of 2-1 to 2-4 leading from one side of the package 1 is subjected to surface treatment for improving solder wettability by solder plating in the end portion (7a) and also subjected to surface treatment for suppressing solder wettability by aluminum plating in the rest of the portion of outer lead not to be soldered (6a). FIG. 4 is a cross-sectional view of the outer lead leading from the package 1. The length (h) of the surface treated portion (7a) from the end of the outer lead 2 is in the range of 25% to 45% of the lead height (l).

Figure 5:
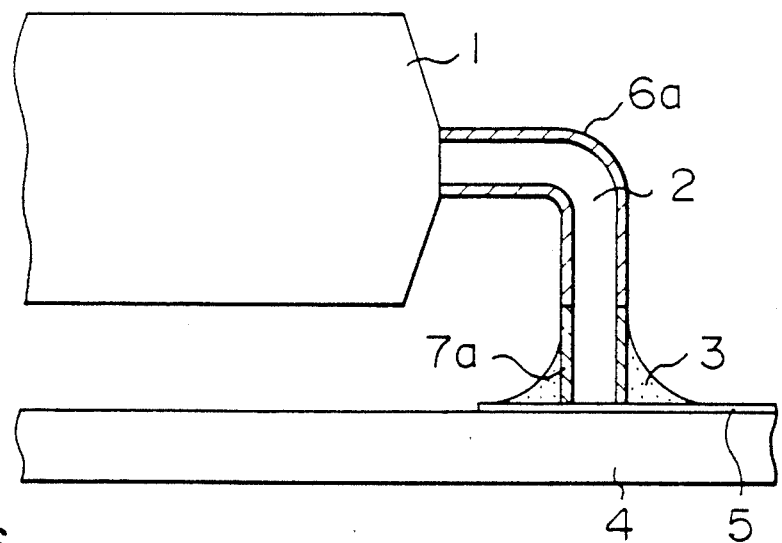
FIGS. 5 and 6 are cross-sectional views of parts of the semiconductor device of Example 1 of the present invention mounted on a substrate.
Figure 6:
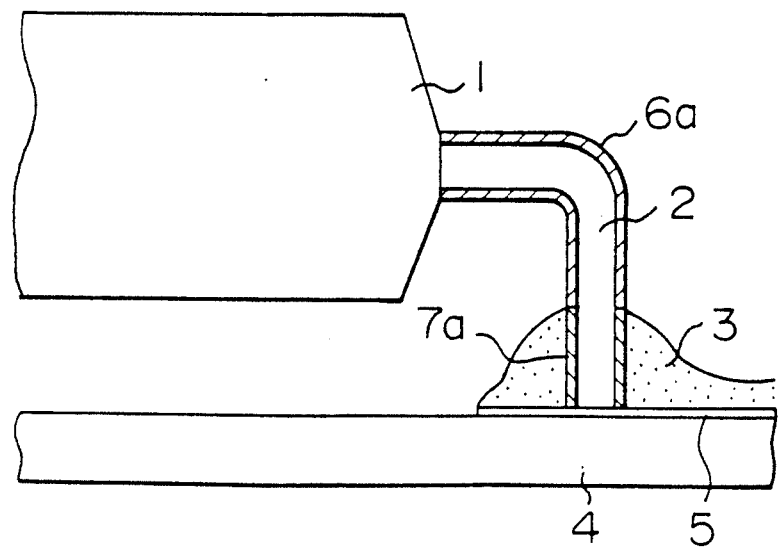

FIGS. 5 and 6 are cross-sectional views of the outer lead 2 leading from the package 1 when mounted on a land 5 formed on a substrate 4 by using solder 3 for bonding. FIG. 5 shows the case when a small amount of solder 3 is used for mounting. In this case, since the surface 7a has good wettability, the solder 3 rises to the upper end of the surface 7a by wetting and the solder wetting height can be maintained at the height of the surface 7a. In contrast, FIG. 6 shows the case when a large amount of solder 3 is used for mounting. In this case, since the surface 6a has poor wettability, the wetting height of solder 3 does not exceed the upper end of the surface 7a.

As mentioned above, according to the present invention, since the solder wetting height (h) can be controlled in the range of 25% to 45% of the lead height (l) irrespective of the amount of solder used for mounting, thermal fatigue life of the solder joint can be improved.

Further, the surface treatment for suppressing solder wettability (6a) is not always necessary for all the portion other than the end portion of the outer lead to be soldered. It is often unnecessary that a portion of the outer lead near the package and of sufficiently far from the solder joint be the surface treated for suppressing solder wettability.

FIG. 17 shows the measurement results of distribution of frequency of solder wetting ratio according to Example 1 of the present invention (curve A) and that of a prior art device of FIG. 11. In each case, the solder wetting ratio (h/l) shown in FIG. 4 is controlled to become 30% and the amount of solder used is the same.

As is clear from FIG. 17, the variation of the solder wetting ratio of the outer lead according to the present invention is very small compared with that of the prior art product. Thus, the solder wetting ratio can be controlled at the best conditions, resulting in improving thermal fatigue life of the solder joint.

EXAMPLE 2

Figure 7:
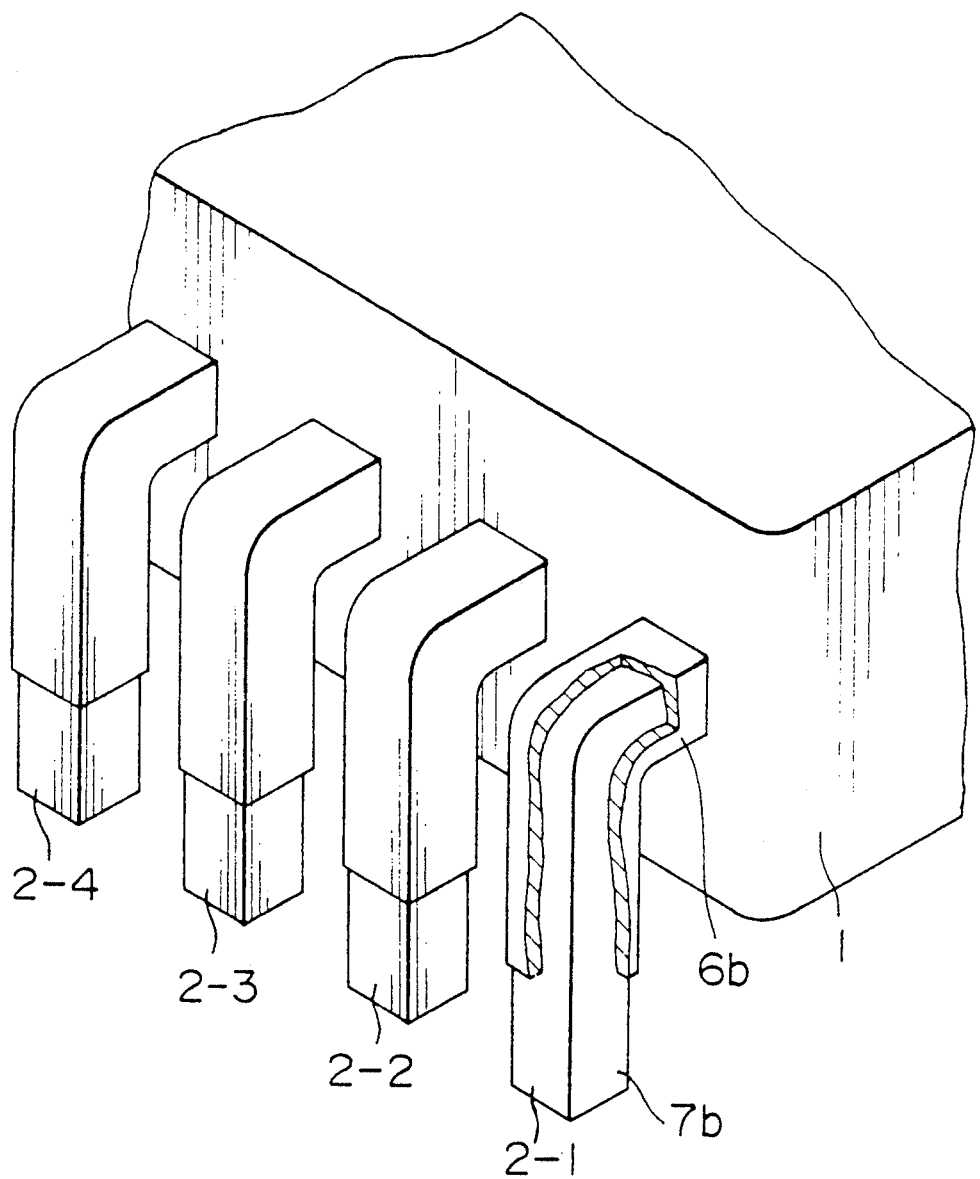
FIG. 7 is a perspective view of a partial, characteristic portion of the semiconductor device of Example 2 of the present invention.

A semiconductor device as shown in FIG. 7 was prepared. In FIG. 7, outer leads 2-1 to 2-4 leading from a side of package 1 are made of copper having good solder wettability. End portions 7b of individual outer leads are not subjected to the surface treatment. The rest of individual portions of outer leads (6b) are subjected to surface treatment for suppressing solder wettability by aluminum plating (h/l = 30%).

Since the solder wetting height was able to be controlled in the same manner as described in Example 1, thermal fatigue life of the solder joints was able to be improved.

As a material for forming the lead frame, it is possible to use an alloy of copper widely used now, nickel, gold, silver or alloys of these metals.

EXAMPLE 3

Figure 8:
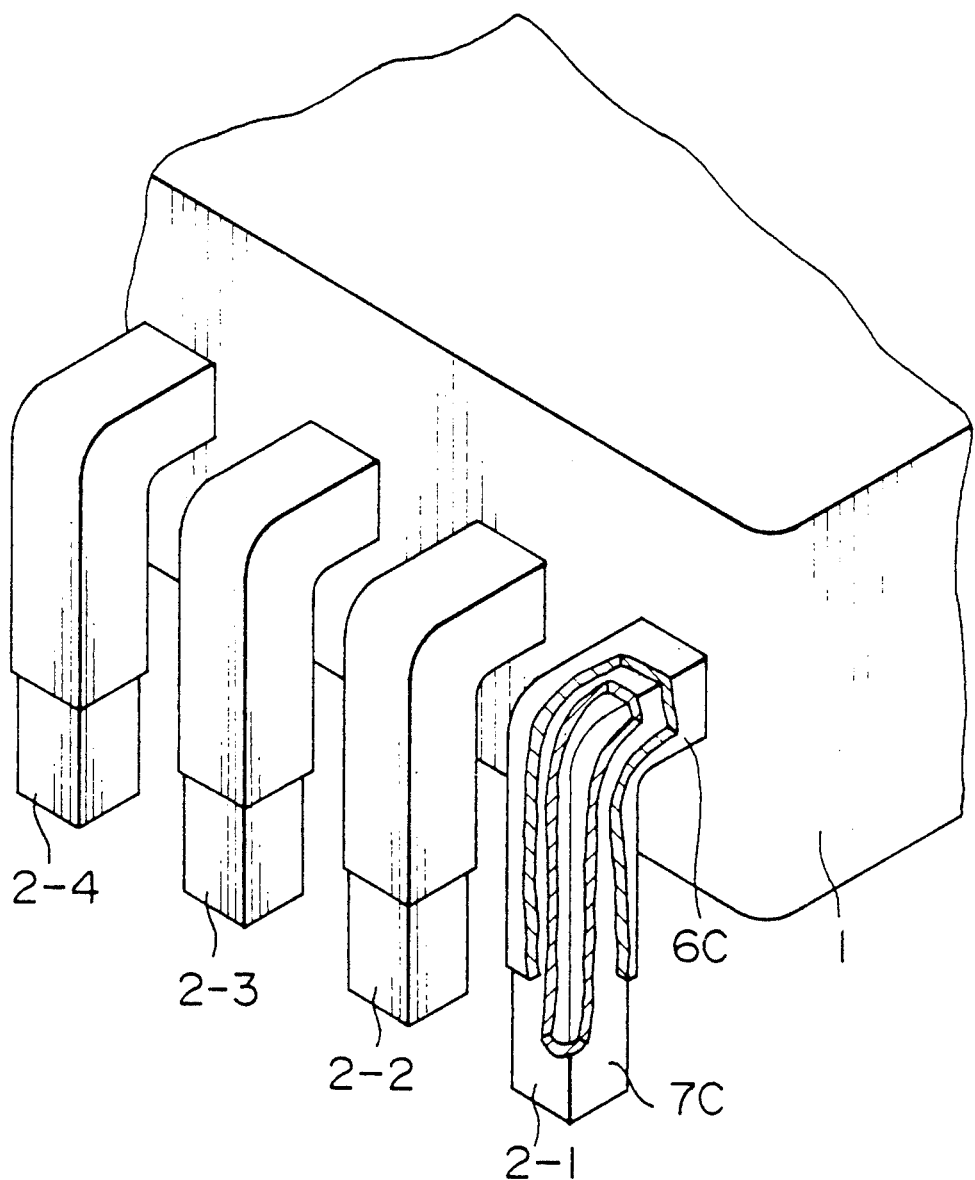
FIG. 8 is a perspective view of a partial, characteristic portion of the semiconductor device of Example 3 of the present invention.

A semiconductor device as shown in FIG. 8 was prepared. In FIG. 8, whole surfaces of individual outer leads 2-1 to 2-4 leading from a side of package 1 are subjected to surface treatment for improving solder wettability by solder plating. Individual portions 6c except for end portions 7c (h/l = 30%) are subjected to surface treatment for suppressing solder wettability by aluminum plating.

Since the solder wetting height was able to be controlled in the same manner as described in Example 1, thermal fatigue life of the solder joints was able to be improved.

In Examples 1 to 3, the end portions of outer leads are not always necessary to be subjected to surface treatment for improving solder wettability. But by subjecting to the surface treatment, the reliability can be improved further more.

Further, the two kinds of surface treatments can be carried out on lead frames before construction of packages, or during construction or after construction of the packages.

In addition, in Examples 1 to 3, the explanations were made as to the small outline I-leaded packages. But, needless to say, the present invention can be applied to quad flat I-leaded packages using butt leads similarly.

EXAMPLE 4.

Figure 9:
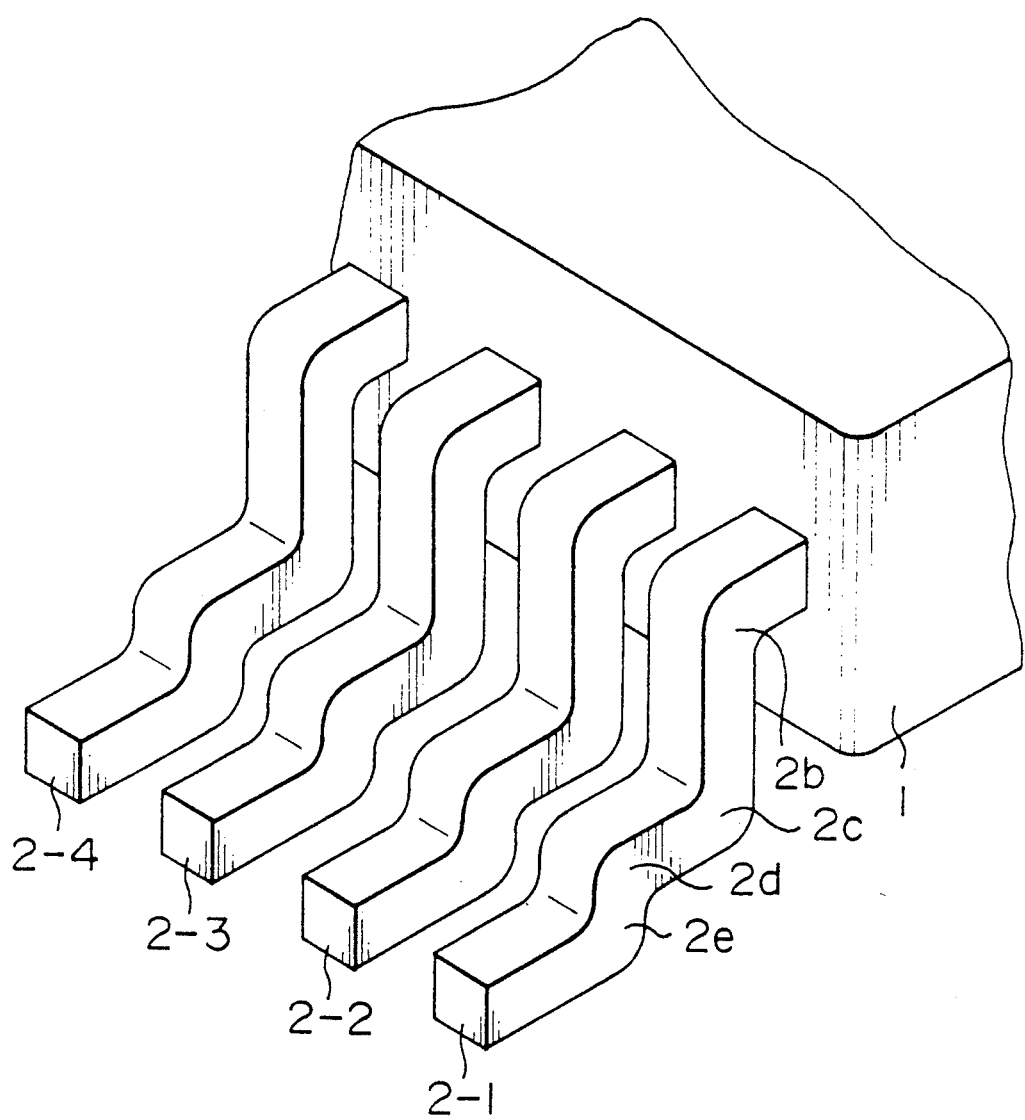
FIG. 9 is a perspective view of partial characteristic portion of the semiconductor device of Example 4 of the present invention.

A semiconductor device (small outline package) as shown in FIG. 9 was prepared. In FIG. 9, individual outer leads 2-1 to 2-4 leading from a package 1 are bent 4 times at points 2b, 2c, 2d and 2e. The portion from the bending points 2c to 2d is higher than the portion from the bending point 2e to the end.

Figure 10:
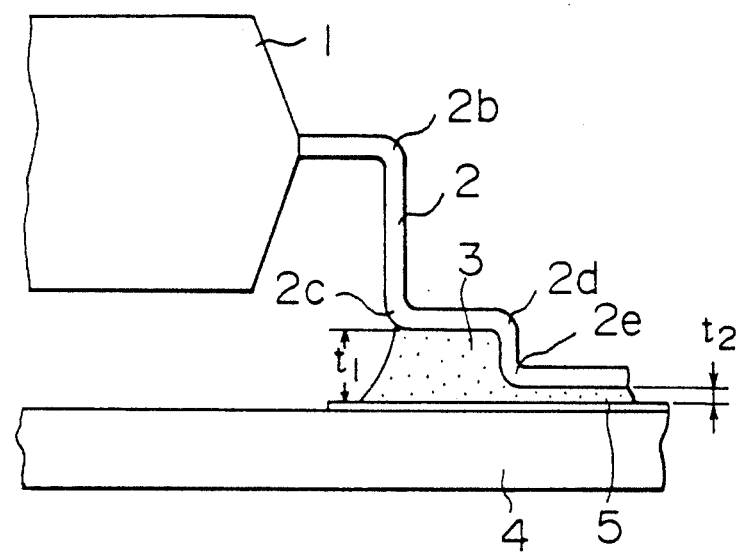
FIG. 10 is a cross-sectional view of a part of the semiconductor device of Example 4 of the present invention mounted on a substrate.

FIG. 10 is a cross-sectional view of an outer lead of FIG. 9 mounted on a substrate. The outer lead 2 leading from the package 1 is bent 4 times at points 2b, 2c, 2d and 2e and bonded to a land 5 formed on a substrate 4 using solder 3. The thickness $t_1$ of a solder joint layer between the bending point 2c-2d and the land 5 is larger than the thickness $t_2$ of a solder joint layer between the bending point 2e to the end and the land 5.

Since at least the thickness of $(t_1-t_2)$ is maintained in the solder layer from the left end wherein the maximum strain has been generated in the solder layer of prior art semiconductor device mounted substrate, thermal fatigue life of solder 3 can be improved by suppressing the generation of maximum strain.

In this case, it should be noted that sufficient rigidity is necessary for the portion from the bending points 2c to 2d.

The same results can be obtained when a quad flat package using a gullwing lead is used in place of the small outline package.

COMPARATIVE EXAMPLE 1

Figure 13:
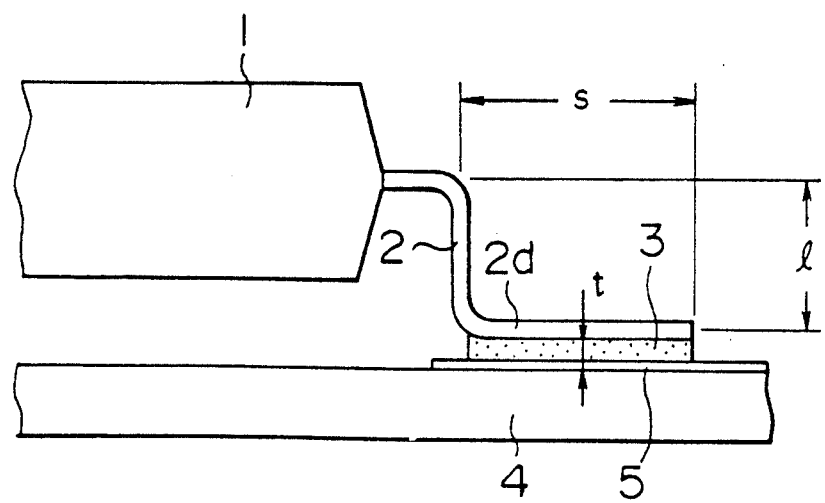

A solder joint of prior art of a lead called "gullwing lead" used in a small outline package or quad flat package is shown in FIG. 13. A lead 2 leading from a side of package 1 is bonded to a wire 5 formed on a substrate 4 via a solder layer 3 at the horizontal portion 2d of the lead 2. The lead height of the package is taken as "l", the length of the horizontal portion 2d "s" and the thickness of the solder layer 3 "t". In this package, relative displacement takes place between the side face of package and the solder joint of the substrate by the temperature change. By this displacement, thermal strain is generated in the solder joint 3.

Figure 14:
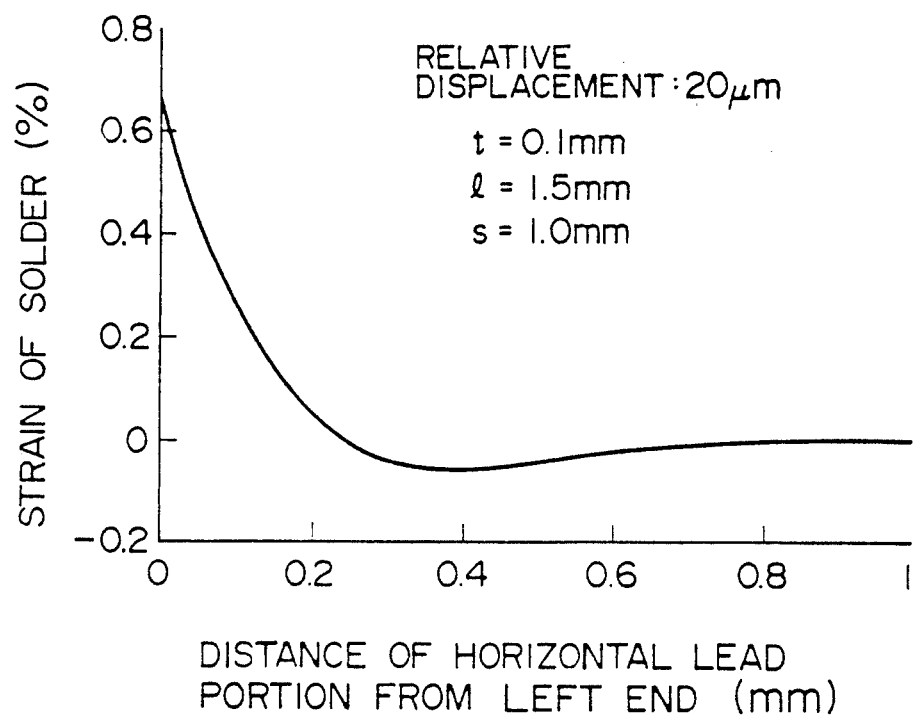
FIG. 14 is a graph showing a strain distribution of solder joint of the semiconductor device of FIG. 13.

Analytical results of strain distribution in the solder layer 3 when the relative displacement of 20 μm was applied between the package and the substrate is shown in FIG. 14. As is clear from FIG. 14, the strain of solder becomes maximum at the left end of the horizontal portion of the lead and almost no strain is generated at the end of the lead.

Therefore, in order to improve the fatigue life of the solder layer 3 of FIG. 13, it is necessary to reduce particularly the strain generated at the left end of the solder layer 3.

Figure 15:
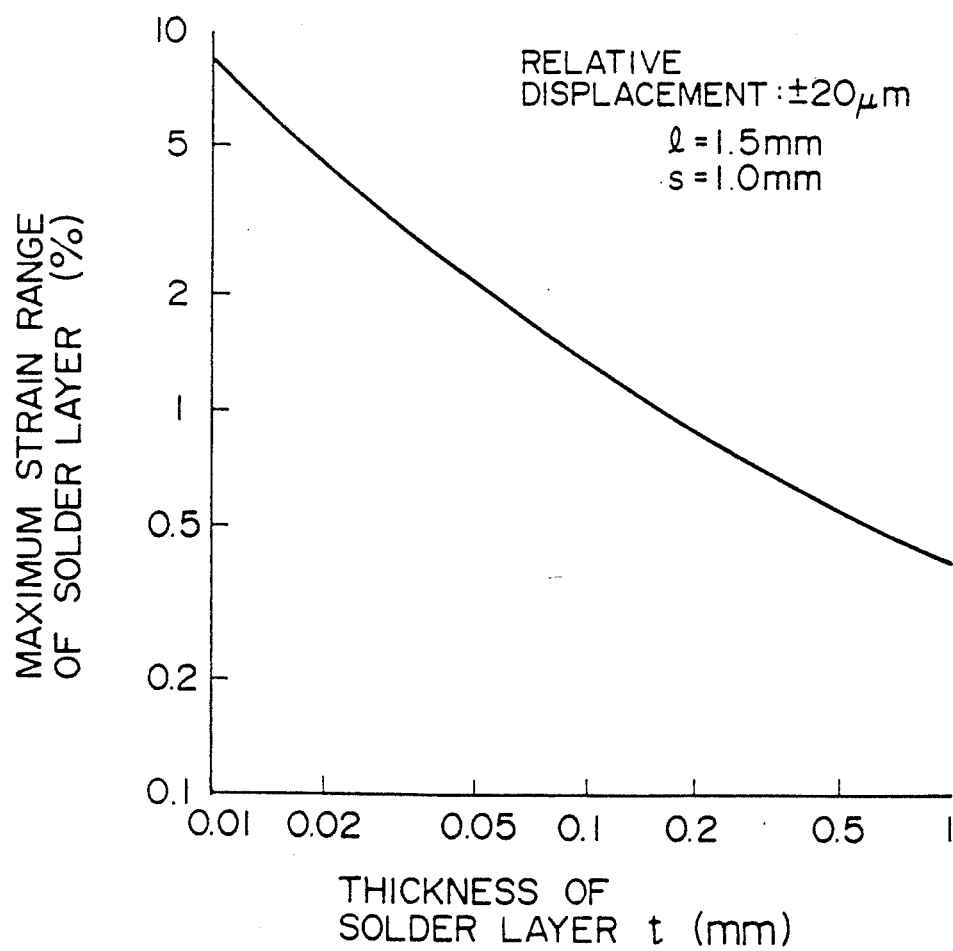
FIG. 15 is a graph showing a relationship between a solder layer thickness and a maximum strain range of the solder layer of the semiconductor device of FIG. 13.

FIG. 15 shows analytical results of a relationship between the solder layer thickness and the maximum strain range generated at the left end of the solder layer when the relative displacement of ±20 μm is applied. In FIG. 15, logarithmic scales are taken along both the ordinate axis and the abscissa axis. As is clear from FIG. 15, the thicker the solder layer becomes, the lesser the strain becomes.

But in practice, since the thickness of the solder layer is reduced by the weight of the package, the thickness of the solder layer is 0.1 mm at most.

As is clear from the above results, in order to improve the life of solder joints of gullwing leads, it is necessary to increase the thickness of the solder layer at the left end of the horizontal portion of the lead wherein the maximum strain is generated.

For such a reason, the outer lead which was bent 2 times according to prior art technique should be bent at least 4 times in order to increase the thickness at the cross point of the vertical portion of the outer lead and the horizontal portion of the outer lead.

EXAMPLE 5

Figure 16:
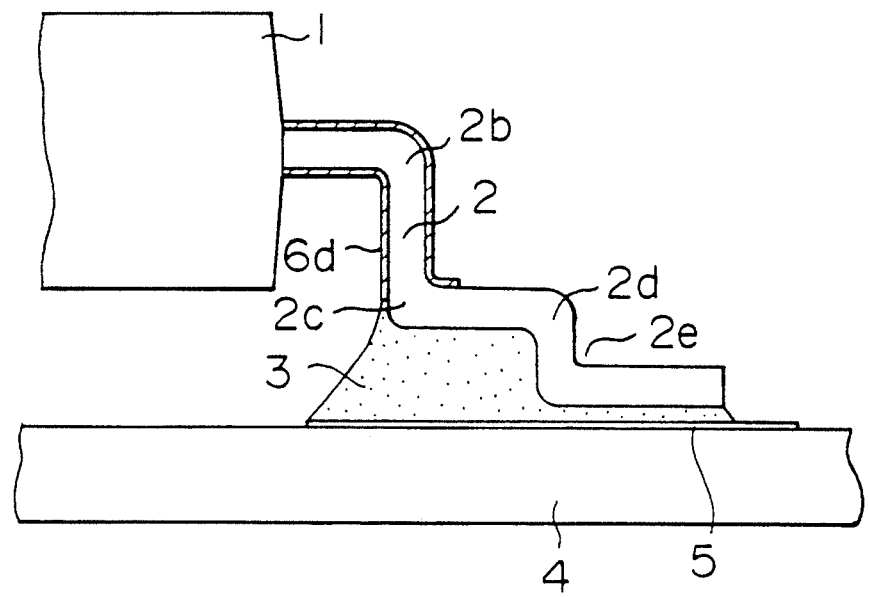
FIG. 16 is a cross-sectional view of a part of the semiconductor device of Example 5.

A semiconductor device as shown in FIG. 16 was prepared in the same manner as described in Examples 1 and 4. In FIG. 16, the portion of the outer lead from the side of package 1 to the bending point 2c is subjected to surface treatment for suppressing solder wettability by aluminum plating (6d) in order to inhibit solder from wetting on the vertical portion (from the bending points 2c to 2b) of the outer lead.

By this surface treatment, the reliability was increased remarkably compared with the case of Example 4.

In the above-mentioned Examples 1 to 5, inner leads, wires, chip pads, semiconductor chips, etc. are not shown, but these are not limited to special ones, and conventional ones can be used.

As mentioned above, when the present invention is applied to small outline I-leaded packages or quad flat I-leaded packages, thermal fatigue life of solder joints can be improved since the size of the solder joints can be controlled under the most suitable conditions.

Further, when the present invention is applied to small outline packages or quad flat packages, since the thickness of the solder joint layer can be secured so as to reduce the maximum strain generated therein, thermal fatigue life of the solder joints can also be improved.

What is claimed is:

1. A lead frame comprising a plurality of inner leads to be packaged and a plurality of outer leads, each end portion of said outer leads being for connection to a substrate by soldering and having a surface which the relatively good solder wettability from being subjected to surface treatment so as to improve solder wettability at least in the case of solder wettability of said outer leads being insufficient, and each of said outer leads having a portion neighboring to said end portion thereof which has a surface with relatively poor solder wettability from being subjected to surface treatment so as to suppress solder wettability.

2. A lead frame according to claim 1, wherein the surface of each end portion is solder comprising lead and tin.

3. A lead frame according to claim 1, further comprising a chip pad formed in the center of the lead frame and wherein said plurality of inner leads are arranged around said chip pad symmetrically or radiately.

4. A lead frame according to claim 1, wherein said outer leads are bent a predetermined distance form the ends thereof, and wherein the length of said end portion surface of each lead which has a relatively good solder wettability is in the range of 25% to 45% of the distance from the end of the lead to the point of the bend.

5. A semiconductor device comprising at least one semiconductor chip, a lead frame having a plurality of inner leads, wires electrically connecting inner leads of said lead frame to said chip, and an encapsulant encapsulating the chip, the inner leads and wires, said lead frame further comprising a plurality of outer leads, each end portion of said outer leads being for connection to a substrate by soldering and having a surface which has relatively good solder wettability from being subjected to surface treatment so as to improve solder wettability at least in the case of solder wettability being insufficient, and each of said outer leads having a portion neighboring to said end portion thereof which has a surface with relatively poor solder wettability from being subjected to surface treatment so as to suppress solder wettability.

6. A semiconductor device according to claim 5, wherein the surface of each end portion is solder comprising lead and tin.

7. A semicondcutor device according to claim 5, wherein the encapsulant is a resin.

8. A semiconductor device according to claim 5, further comprising a chip pad formed in the center of the lead frame and wherein said plurality of inner leads are arranged around said chip pad symmetrically or radiately.

9. A semiconductor device according to claim 5, wherein said outer leads are bent a predetermined distance from the ends thereof, and wherein the length of said end portion surface of each lead which has a relatively good solder wettability is in the range of 25% to 45% of the distance from the end of the lead to the point of the bend.

10. A semiconductor device comprising at least one semiconductor chip, a lead frame having a plurality of inner leads and a plurality of outer leads, wires electrically connecting inner leads of said lead frame to said chip, and an encapsulant encapsulating the chip, the inner leads and the wire, said outer leads each having a surface on an end portion thereof with relatively good solder wettability from being subjected to surface treatment so that it can be wetted with solder comprising lead and tin, said end portion of the outer lead extending from the end a distance in the range of 25% to 45% of the distance from the end to a point of the outer lead to be bent and at least each portion neighboring to said end portions having a surface with relatively poor solder wettability from being subjected to surface treatment so as to suppress wettability for solder comprising lead and tin.

11. A semiconductor device according to claim 10, wherein the device is a small outline I-leaded package.

12. A semiconductor device according to claim 10, wherein the device is a quad flat I-leaded package.

13. A semiconductor device comprising at least one semiconductor chip, a lead frame having a plurality of inner leads and a plurality of outer leads, wires electrically connecting inner leads of said lead frame to said chip, and an encapsulant encapsulating the chip, the inner leads and the wire, each of said outer leads being bent at least 4 times and having an end horizontal portion to be face bonded to a substrate, with the position of a third bending portion from the end being higher than the end horizontal portion.

14. A semiconductor device according to claim 13, wherein the device is a small outline package.

15. A semiconductor device according to claim 13, wherein the device is a quad flat package.

16. A lead frame comprising a plurality of inner leads to be packaged and a plurality of outer leads, each outer lead being bent at least 4 times and having an end horizontal portion to be face bonded to a substrate.

17. A lead frame according to claim 16, further comprising a chip pad formed in the center of the lead frame and a plurality of inner leads arranged around the chip portion symmetrically or radiately.

18. A semiconductor device according to claim 13, wherein at least a portion of an outer lead neighboring to a portion to be face bonded by soldering has a surface with relatively poor solder wettability from being subjected to surface treatment for suppressing solder wettability.

19. A lead frame according to claim 1, wherein the surface having relatively good solder wettability is a metal coating on the outer lead as a result of solder plating, solder dipping or nickel plating.

20. A lead frame according to claim 1, wherein the neighboring portion of each outer lead is coated by one of resin coating, aluminum plating, aluminum sputtering, or oxidation to suppress the solder wettability of the underlying material of the outer lead.

* * * * *